US006842362B2

(12) United States Patent
Fujita et al.

(10) Patent No.: US 6,842,362 B2
(45) Date of Patent: Jan. 11, 2005

(54) MAGNETIC RANDOM ACCESS MEMORY

(75) Inventors: Katsuyuki Fujita, Yokohama (JP);
Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/368,609

(22) Filed: Feb. 20, 2003

(65) Prior Publication Data

US 2004/0057278 A1 Mar. 25, 2004

(30) Foreign Application Priority Data

Sep. 25, 2002 (JP) .................................... 2002-279744

(51) Int. Cl.[7] ............................................. G11C 11/00
(52) U.S. Cl. ............. 365/158; 365/185.17; 365/185.23; 365/189.01; 365/230.01; 365/230.06
(58) Field of Search ........................... 365/158, 185.17, 365/185.23, 189.01, 230.01, 230.08, 230.06

(56) References Cited

U.S. PATENT DOCUMENTS 6,111,783 A      8/2000  Tran et al. .................. 365/171
6,490,191 B2 *  12/2002  Pöchmüller ................. 365/158
6,646,911 B2 *  11/2003  Hidaka ........................ 365/173
6,693,822 B2 *   2/2004  Ito ............................... 365/158

OTHER PUBLICATIONS

Takeshi Honda, et al., "MRAM–Writing Circuitry to Compensate for Thermal–Variation of Magnetization–Reversal Current", 2002 Symposium on VLSI Circuits Digest of Technical Papers, 2002, pp. 156–157.

* cited by examiner

Primary Examiner—Son T. Dinh
Assistant Examiner—Pho M. Luu
(74) Attorney, Agent, or Firm—Oblon, Spivak, McClelland, Maier & Neustadt, P.C.

(57) ABSTRACT

One end of a write word line is connected to a decoder/driver unit. The decoder/driver unit is constituted by a P channel MOS transistor, an N channel MOS transistor, a differential amplifier, and an NAND circuit. When WRITE, CHRDY and RA1 all become "H", an output signal from the NAND circuit becomes "H", and a write current flows through the write word line. At this moment, a value of the write current is restricted to a value which does not exceed VLIMIT/R1 by the differential amplifier. R1 is a wiring resistance of the write word line.

14 Claims, 6 Drawing Sheets

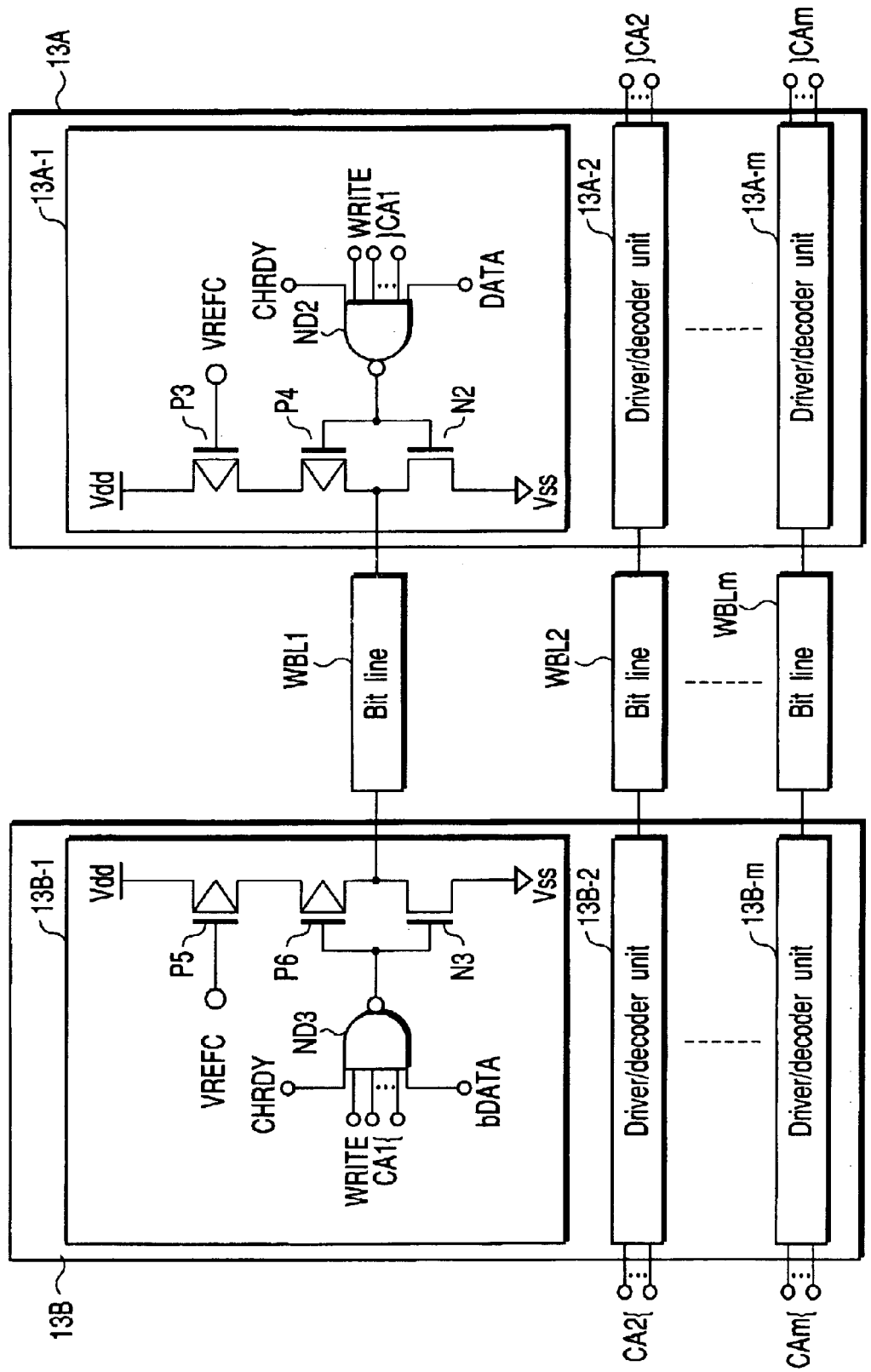
F I G. 3

MAGNETIC RANDOM ACCESS MEMORY

CROSS-REFERENCE TO RELATED APPLICATIONS

This application is based upon and claims the benefit of priority from the prior Japanese Patent Application No. 2002-279744, filed Sep. 25, 2002, the entire contents of which are incorporated herein by reference.

BACKGROUND OF THE INVENTION

1. Field of the Invention

The present invention relates to a magnetic random access memory (MRAM) which uses a magneto-resistive effect element as a storage element.

2. Description of the Related Art

In recent years, research and development of a magnetic random access memory which stores data in a non-volatile manner by utilizing a magneto-resistive effect have been frequently carried out.

The magnetic random access memory stores data "1" and "0" by using a magneto-resistive effect element (a TMR element, a GMR element or the like). The basic structure of the magneto-resistive effect element is a structure sandwiching a tunneling barrier by two magnetic layers.

Data stored in the magneto-resistive effect element is judged by whether directions of magnetization of the two magnetic layers are the same (parallel state) or opposite to each other (anti-parallel state).

Here, an anti-magnetic layer for fixing a direction of magnetization of a fixed layer is brought into contact with one (fixed layer) of the two magnetic layers. As a result, data to be stored in the magneto-resistive effect element is actually determined based on a direction of magnetization of the other one (free layer) of the two magnetic layers.

When magnetization of the magneto-resistive effect element enters the parallel state, the tunnel resistance of the tunneling barrier sandwiched between the two magnetic layers constituting the magneto-resistive effect element becomes lowest. This state is, for example, the state "1". Further, when magnetization of the magneto-resistive effect element enters the anti-parallel state, the tunnel resistance of tunneling barrier sandwiched between the two magnetic layers constituting the magneto-resistive effect element becomes highest. This state is, for example, the state "0".

In the magnetic random access memory, a write current is used when programming data. The write current is caused to flow through two write lines crossing each other at a point where the magneto-resistive effect element is positioned. The state of magnetization of the magneto-resistive effect element is controlled by a combined magnetic field generated by the write current flowing through the two write lines.

Meanwhile, one of characteristics of the magnetic random access memory lies in higher integration of a memory cell (magneto-resistive effect element). However, when realization of the finer element and higher integration advances, irregularities in the element characteristic caused due to shifting of a pattern, irregularities in an element shape or the like in manufacture can not be ignored.

For example, when there occur irregularities in a threshold voltage of a transistor constituting a write driver due to irregularities in process, a large write current which generates a magnetic field exceeding the intensity of the magnetic field required for programming may be possibly caused to flow through the write lines.

In this case, program data may be erroneously written in a non-selected memory cell (magneto-resistive effect element) adjacent to a selected memory cell (magneto-resistive effect element) which is a target of programming.

BRIEF SUMMARY OF THE INVENTION

A magnetic random access memory according to an aspect of the present invention has a memory cell array determining an element having a magnetic layer as a memory cell, a first write line for writing data in the memory cell, and a first driver connected to one end of the first write line, and the first driver has a first limiting circuit which limits, to a fixed value or a lower value, a value of a write current to be given to the first write line.

BRIEF DESCRIPTION OF THE SEVERAL VIEWS OF THE DRAWING

FIG. 3 is a circuit diagram showing an aspect of a write bit line driver/decoder;

DETAILED DESCRIPTION OF THE INVENTION

A magnetic random access memory concerning an aspect of the present invention will now be described in detail hereinafter with reference to the accompanying drawing.

1. Entire Structure

Figure 1:
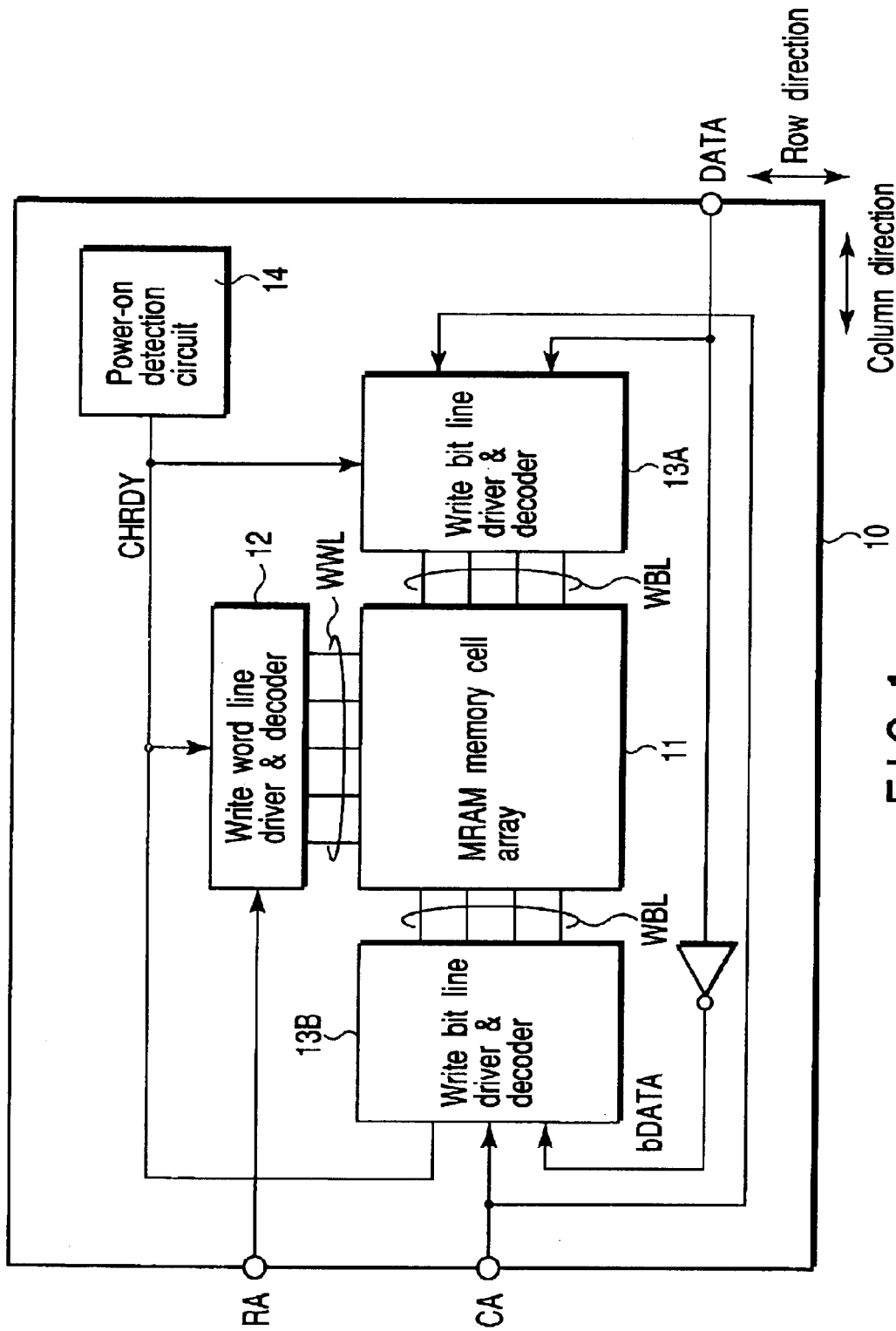
FIG. 1 is a block diagram showing a primary part of a semiconductor memory according to an aspect of the present invention.

FIG. 1 is a block diagram showing a primary part of a magnetic random access memory according to an embodiment of the present invention.

In a memory chip 10 are arranged a memory cell array, for example, an MRAM memory cell array 11 having a magneto-resistive effect element as a memory cell, a write word line driver/decoder 12, write bit line drivers/decoders 13A and 13B, and a power-on detection circuit 14.

The write word line driver/decoder 12 is provided at one end of the memory cell array 11 in a row direction. The write word line driver/decoder 12 has a function to decode a row address signal RA and pass a write current which always flows in one direction through a write word line WWL selected by the row address signal RA in a write operation.

The write bit line driver/decoder 13A is provided at one end of the memory cell array 11 in a column direction, and the write bit line driver/decoder 13B is provided at the other end of the memory cell array 11 in the column direction. The write bit line drivers/decoders 13A and 13B have a function to decode a column address signal CA and pass a write current which flows in a direction according to a value of program data DATA through a write bit line WBL selected by the column address signal CA in a write operation.

The power-on detection circuit 14 has a function to detect that a power supply is turned on. When the power-on detection circuit 14 confirms that an initialization operation of all the internal circuits in the semiconductor memory is completed after turning on the power supply, it changes a detection signal CHRDY from "L" to "H". The detection signal CHRDY is supplied to the write word line driver/decoder 12 and the write bit line drivers/decoders 13A and 13B.

2. Write Word Line Driver/decoder

Figure 2:
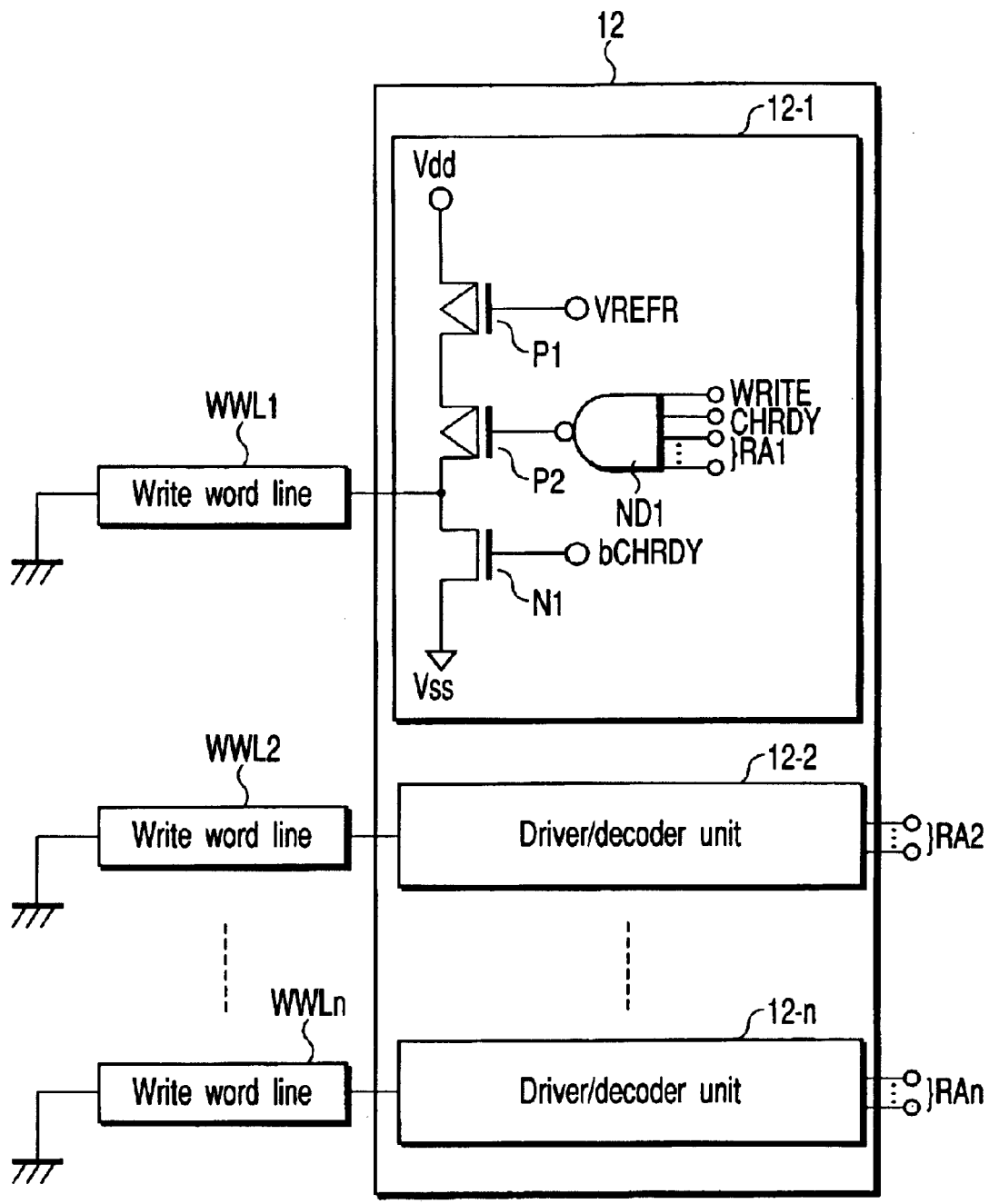
FIG. 2 is a circuit diagram showing an aspect of a write word line driver/decoder.

FIG. 2 shows a circuit example of the write word line driver/decoder.

The write word line driver/decoder 12 is constituted by a plurality of driver/decoder units 12-1, 12-2, . . . 12-n corresponding to a plurality of write word lines WWL1, WWL2, . . . WWLn.

The circuit configurations of the respective driver/decoder units are the same.

When the row address signal RA selects the write word line WWL1, all the bits become "H" with respect to only the row address signal RA1 inputted to the driver/decoder unit 12-1.

In general, when the row address signal RA selects the write word line WWLn, all the bits become "H" with respect to only the row address signal RAn inputted to the driver/decoder unit 12-n.

The driver/decoder unit 12-1 is constituted by P channel MOS transistors P1 and P2 and an N channel MOS transistor N1 connected in series between a power supply terminal Vdd and a ground terminal Vss, and an NAND gate circuit ND1.

To the NAND gate circuit ND1 are inputted a write signal WRITE, a detection signal CHRDY and a row address signal RA1.

The write signal WRITE is a signal which becomes "H" in the write operation. As described above, the detection signal CHRDY becomes "H" when the initialization operation of al the internal circuits in the semiconductor memory is completed after turning on the power supply. Furthermore, when the write current is caused to flow through the write word line WWL1, all the bits of the row address signal RA1 become "H".

An output node of the NAND gate circuit ND1 is connected to a gate of the P channel MOS transistor P2.

Therefore, when all of the write signal WRITE, the detection signal CHRDY and the row address signal RA1 become "H", an output signal from the NAND gate circuit ND1 becomes "L", and the P channel MOS transistor P2 enters the on state. Moreover, when the detection signal CHRDY becomes "H", the N channel MOS transistor N1 enters the off state.

Therefore, at this moment, the write current is supplied from the power supply terminal Vdd to the write word line WWL1.

Here, in this example, a value of the write current is restricted by the P channel MOS transistor P1. That is, a value of the write current can be controlled so as not to exceed a fixed value by controlling a value of a gate potential VREFR of the P channel MOS transistor P1.

3. Write Bit Line Driver/Decoder

FIG. 3 shows a circuit example of the write bit line driver/decoder.

The write bit line drivers/decoders 13A and 13B are constituted by a plurality of driver/decoder units 13A-1, 13A-2, . . . 13A-m, 13B-1, 13B-2, . . . 13B-m corresponding to a plurality of write bit lines WBL1, WBL2, . . . WBLm.

The circuit configurations of the respective driver/decoder units are the same.

When the column address signal CA selects the write bit line WBL1, all the bits become "H" with respect to only the column address signal CA1 inputted to the driver/decoder units 13A-1 and 13B-1.

In general, when the column address signal CA selects the write bit line WBLm, all the bits become "H" with respect to only the column address signal CAm inputted to the driver/decoder units 13A-m and 13B-m.

The driver/decoder unit 13A-1 is constituted by P channel MOS transistors P3 and P4 and an N channel MOS transistor N2 connected in series between a power supply terminal Vdd and a ground terminal Vss, and an NAND gate circuit ND2. The driver/decoder unit 13B-1 is constituted by P channel MOS transistors P5 and P6 and an N channel MOS transistor N3 connected in series between the power supply terminal Vdd and the ground terminal Vss, and an NAND gate circuit ND3.

To the NAND gate circuit ND2 in the driver/decoder unit 13A-1 are inputted a write signal WRITE, a detection signal CHRDY, a column address signal CA1 and program data DATA. To the NAND gate circuit ND3 in the driver/decoder unit 13B-1 are inputted a write signal WRITE, a detection signal CHRDY, a column address signal CA1 and data bDATA which is opposite to the program data.

An output node of the NAND gate circuit ND2 is connected to a gate of the P channel MOS transistor P4 and a gate of the N channel MOS transistor N2, and an output node of the NAND gate circuit ND3 is connected to a gate of the P channel MOS transistor P6 and a gate of the N channel MOS transistor N3.

Therefore, when all of the write signal WRITE, the detection signal CHRDY and the row address signal RA1 become "H", a write current having a direction according to a value of the program data DATA is caused to flow through the write bit line WBL1.

For example, when the program data DATA is "1" (="H"), an output signal from the NAND gate circuit ND2 in the driver/decoder unit 13A-1 becomes "L", the P channel MOS transistor P4 enters the on state, and the N channel MOS transistor N2 enters the off state.

In addition, an output signal from the NAND gate circuit ND3 in the driver/decoder unit 13B-1 becomes "H", the P channel MOS transistor P6 enters the off state, and the N channel MOS transistor N3 enters the on state.

Therefore, at this moment, the write current which is directed from the driver/decoder unit 13A-1 to the driver/decoder unit 13B-1 flows through the write bit line WBL1.

Here, in this example, a value of the write current is restricted by the P channel MOS transistor P3 in the driver/decoder unit 13A-1. That is, a value of the write current can be restricted so as not to exceed a fixed value by setting a value of a gate potential VREFC of the P channel MOS transistor P3 to a fixed value.

On the other hand, when the program data DATA is "0" (="L"), an output signal from the NAND gate circuit ND2 in the driver/decoder unit 13A-1 becomes "H", the P channel MOS transistor P4 enters the off state, and the N channel MOS transistor N2 enters the on state.

Additionally, an output signal from the NAND gate circuit ND3 in the driver/decoder unit 13B-1 becomes "L", the P channel MOS transistor P6 enters the on state, and the N channel MOS transistor N3 enters the off state.

Therefore, at this moment, the write current which is directed from the driver/decoder unit 13B-1 to the driver/decoder unit 13A-1 flows through the write bit line WBL1.

Here, in this example, a value of the write current is restricted by the P channel MOS transistor P5 in the driver/decoder unit 13B-1. That is, a value of the write current can be restricted so as not to exceed a fixed value by controlling a value of a gate potential VREFC of the P channel MOS transistor P5.

4. VREFR and VREFC Generation Circuits

Figure 4:
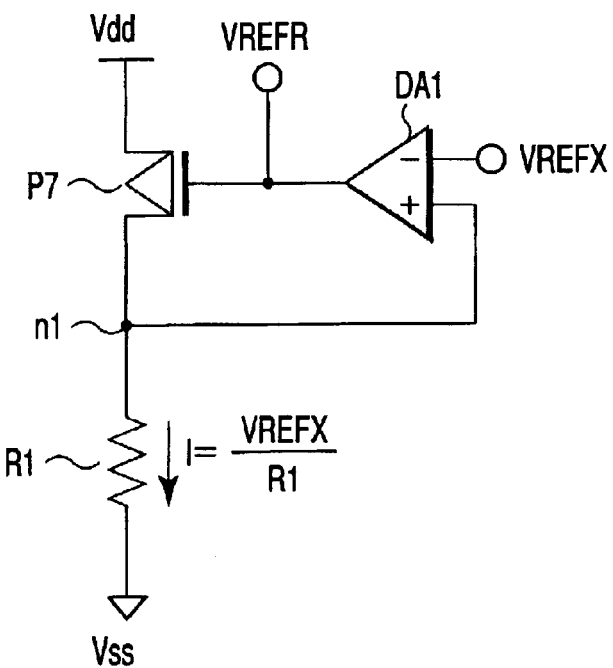
FIG. 4 is a circuit diagram showing an aspect of a circuit which generates VREFR.

FIG. 4 shows an example of a circuit which generates VREFR.

This circuit is constituted by a P channel MOS transistor P7 and a resistance R1 connected in series between the power supply terminal Vdd and the ground terminal Vss, and a differential amplifier DA1 whose plus side input node is connected to a connection node n1 of the P channel MOS transistor P7 and the resistance R1, whose minus side input node receives VREFX and whose output node is connected to a gate of the P channel MOS transistor P7.

VREFX is a signal which determines a maximum value of a voltage applied to both ends of the write word line WWLn, in other words, a maximum value of the write current flowing through the write word line WWLn. A value of VREFX is determined based on a test result of the operation characteristic of the circuit in the memory chip, and this value is stored in an information storage portion in the memory chip and read from the information storage portion after turning on the power supply.

This circuit controls a gate potential of the P channel MOS transistor P7 in such a manner that a potential of the connection node n1 of the P channel MOS transistor P7 and the resistance R1 becomes equal to VREFX.

Here, the P channel MOS transistor P7 corresponds to the P channel MOS transistor P1 shown in FIG. 2, and the resistance R1 corresponds to a wiring resistance of the write word line WWL1 illustrated in FIG. 2.

Therefore, the maximum value of the voltage applied to the both ends of the write word line WWL1 is restricted to VREFX by the VREFR generation circuit shown in FIG. 4. That is, assuming that the wiring resistance of the write word line WWL1 depicted in FIG. 2 is R1, the maximum value of the write current flowing through the write word line WWL1 is restricted to VREFX/R1.

Figure 5:
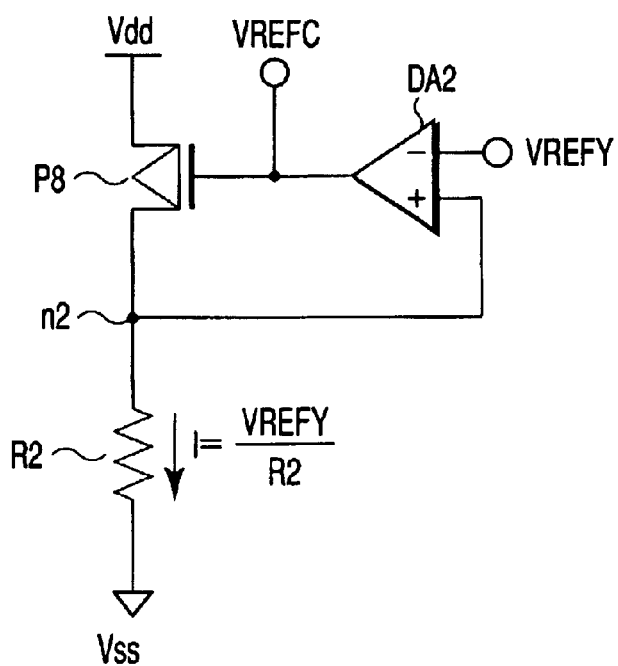
FIG. 5 is a circuit diagram showing an aspect of a circuit which generates VREFC.

FIG. 5 shows an example of the circuit which generates VREFC.

This circuit is constituted by a P channel MOS transistor P8 and a resistance R2 connected in series between the power supply terminal Vdd and the ground terminal Vss, and a differential amplifier DA2 whose plus side input node is connected to a connection node n2 of the P channel MOS transistor P8 and the resistance R2, whose minus side input node receives VREFY and whose output node is connected to a gate of the P channel MOS transistor P8.

VREFY is a signal which determines a maximum value of a voltage applied to both ends of a write bit line WBLm, in other words, a maximum value of the write current flowing through the write bit line WBLm. A value of VREFY is determined based on a test result of the operation characteristic of the circuit in the memory chip, and this value is stored in an information storage portion in the memory chip and read from the information storage portion after tuning on the power supply.

This circuit controls a gate potential of the P channel MOS transistor P8 in such a manner that a potential of the connection node n2 of the P channel MOS transistor P8 and the resistance R2 becomes equal to VREFY.

Here, the P channel MOS transistor P8 corresponds to the P channel MOS transistors P3 and P5 in FIG. 3, and the resistance R2 corresponds to the wiring resistance of the write bit line WBL1 in FIG. 3.

Therefore, the maximum value of the voltage applied to the both ends of the write bit line WBL1 is restricted to VREFY by the VREFC generation circuit shown in FIG. 5. That is, assuming that the wiring resistance of the write bit line WBL1 shown in FIG. 3 is R2, the maximum value of the write current flowing through the write bit line WBL1 is restricted to VREFY/R2.

5. Write Word Line Driver/Decoder (Modification)

Figure 6:
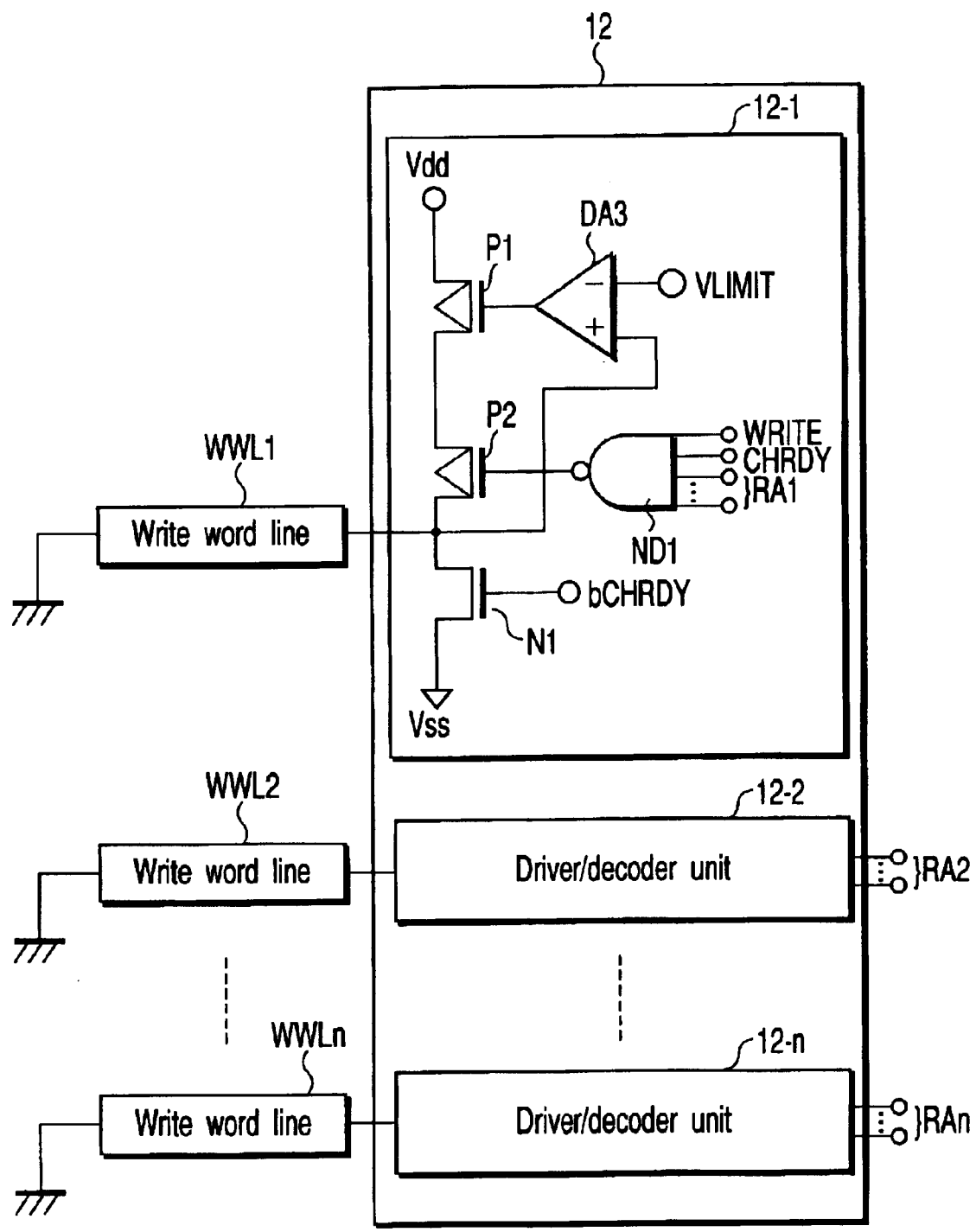
FIG. 6 is a circuit diagram showing another aspect of the write word line driver/decoder.

FIG. 6 shows a modification of the write word line driver/decoder.

This write word line driver/decoder is characterized in that a circuit which limits a maximum voltage applied to the both ends of the write word line WWLn to a fixed value or a lower value is provided in the write word line driver/decoder shown in FIG. 2.

In the write word line driver/decoder 12 illustrated in FIG. 2, providing one VREFR generation circuit (FIG. 4) commonly to all the driver/decoder units 12-1, 12-2, ... 12-n can suffice, but the circuit which limits the maximum voltage applied to the both ends of the write word line WWLn to a fixed value or a lower value is provided in each driver/decoder unit in the write word line driver/decoder 12 of this example.

The write word line driver/decoder 12 is constituted by a plurality of driver/decoder units 12-1, 12-2, ... , 12-n corresponding to a plurality of write word lines WWL1, WWL2, ... WWLn.

The circuit configurations of the respective driver/decoder units are the same.

When the row address signal RA selects the write word line WWL1, all the bits become "H" with respect to only the row address signal RA1 inputted to the driver/decoder unit 12-1. Similarly, when the row address signal RA selects the write word line WWLn, all the bits become "H" with respect to only the row address signal RAn inputted to the driver/decoder unit 12-n.

The driver/decoder unit 12-1 is constituted by P channel MOS transistors P1 and P2 and an N channel MOS transistor N1 connected in series between the power supply terminal Vdd and the ground terminal Vss, a differential amplifier DA3, and an NAND gate circuit ND1.

A write signal WRITE, a detection signal CHRDY and a row address signal RA1 are inputted to the NAND gate circuit ND1.

The write signal WRITE is a signal which becomes "H" in the write operation. The detection signal CHRDY becomes "H" upon completion of the initialization operation of all the internal circuits in the semiconductor memory. Furthermore, in case of passing the write current through the write word line WWL1, all the bits of the row address signal RA1 become "H".

An output node of the NAND gate circuit ND1 is connected to a gate of the P channel MOS transistor P2.

Therefore, when the write signal WRITE, the detection signal CHRDY and the row address signal RA1 all become "H", an output signal from the NAND gate circuit ND1 becomes "L", and the P channel MOS transistor P2 enters the on state. Moreover, when the detection signal CHRDY becomes "H", the N channel MOS transistor N1 enters the off state.

Therefore, at this moment, the write current is supplied from the power supply terminal Vdd to the write word line WWL1.

Here, in this example, a value of the write current is restricted by the P channel MOS transistor P1. That is, a gate potential of the P channel MOS transistor P1 is controlled by the differential amplifier DA3. The differential amplifier DA3 controls the gate potential of the P channel MOS transistor P1 in such a manner a drain potential of the P channel MOS transistor P2, namely, a potential at one end of the write word line WWL1 becomes equal to VLIMIT.

Therefore, the maximum value of the voltage applied to the both ends of the write word line WWL1 is restricted to VLIMIT. That is, assuming that the wiring resistance of the write word line WWL1 is R1, the maximum value of the write current flowing through the write word line WWL1 is restricted to VLIMIT/R1.

6. Write Bit Line Driver/Decoder (Modification)

Figure 7:
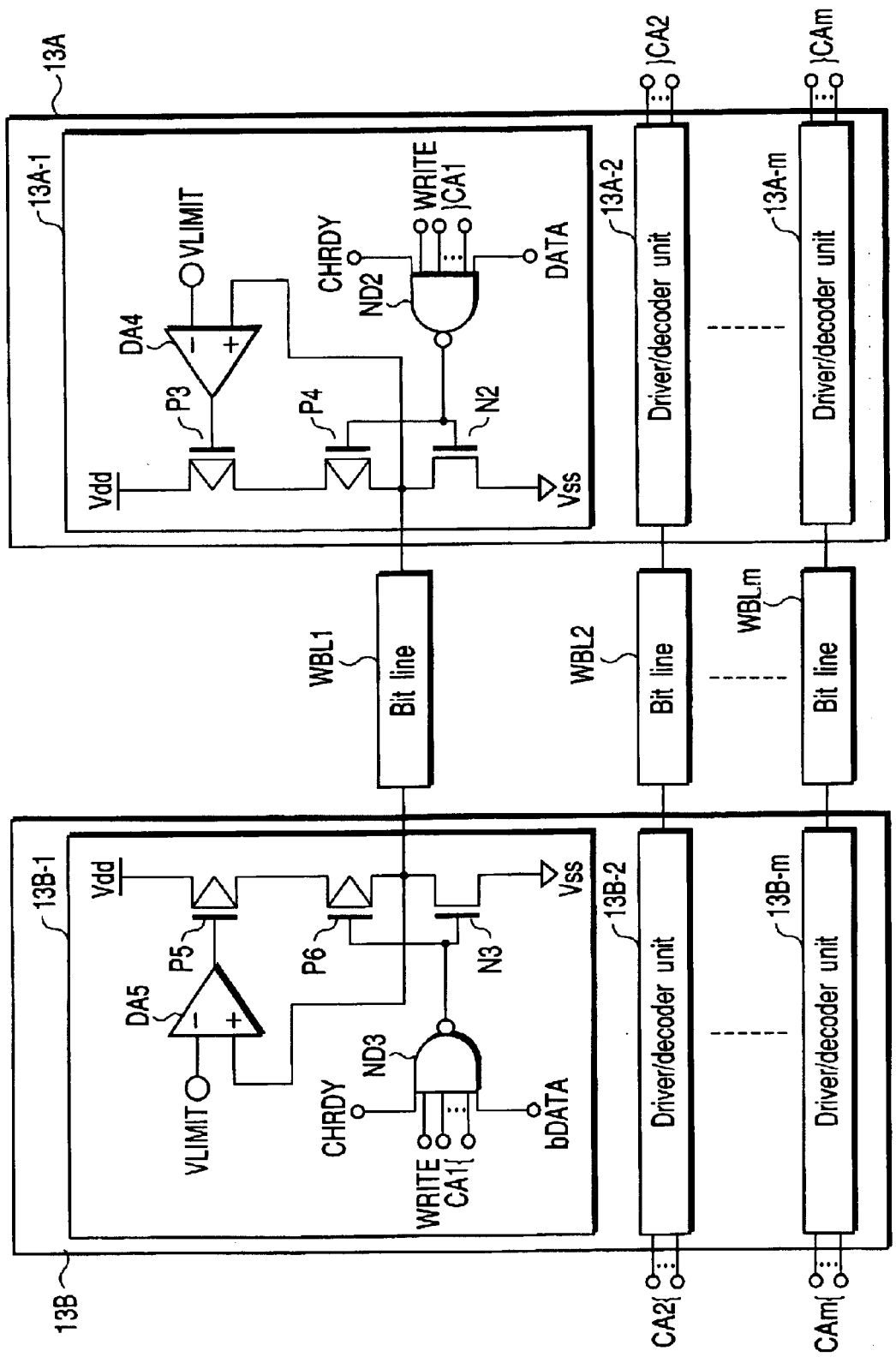
FIG. 7 is a circuit diagram showing another aspect of the write bit line driver/decoder.

FIG. 7 shows a modification of the write bit line driver/decoder.

The write bit line driver/decoder is characterized in that a circuit which limits a maximum voltage applied to the both ends of the write bit line WBLm to a fixed value or a lower value is provided in the write bit line driver/decoder shown in FIG. 3.

In the write bit line drivers/decoders 13A and 13B shown in FIG. 3, providing one VREFC generation circuit (FIG. 5) commonly to all the driver/decoder units 13A-1, 13A-2, . . . 13A-m, 13B-1, 13B-2, . . . 13B-m can suffice. However, in the write bit line drivers/decoders 13A and 13B in this example, a circuit which limits the maximum voltage applied to the both ends of the write bit line WBLm to a fixed value or a lower value is provided in each driver/decoder unit.

The write bit line drivers/decoders 13A and 13B is constituted by a plurality of driver/decoder units 13A-1, 13A-2, . . . 13A-m, 13B-1, 13B-2, . . . 13B-m corresponding to a plurality of write bit lines WBL1, WBL2, . . . WBLm.

The circuit configurations of the respective driver/decoder units are the same.

When the column address signal CA selects the write bit line WBL1, all the bits become "H" with respect to only the column address signal CA1 inputted to the driver/decoder units 13A-1 and 13B-1. Similarly, when the column address signal CA selects the write bit line WBLm, all the bits become "H" with respect to only the column address signal CAm inputted to the driver/decoder units 13A-m and 13B-m.

The driver/decoder unit 13A-1 is constituted by P channel MOS transistors P3 and P4 and an N channel MOS transistor N2 connected in series between the power supply terminal Vdd and the ground terminal Vss, a differential amplifier DA4, and an NAND gate circuit ND2. The driver/decoder unit 13B-1 is constituted by P channel MOS transistors P5 and P6 and an N channel MOS transistor N3 connected in series between the power supply terminal Vdd and the ground terminal Vss, a differential amplifier DA5, and an NAND gate circuit ND3.

A write signal WRITE, a detection signal CHRDY, a column address signal CA1 and program data DATA are inputted to the NAND gate circuit ND2 in the driver/decoder unit 13A-1. The write signal WRITE, the detection signal CHRDY, the column address signal CA1, and data bDATA which is opposite to the program data are inputted to the NAND gate circuit ND3 in the driver/decoder unit 13B-1.

An output node of the NAND gate circuit ND2 is connected to a gate of the P channel MOS transistor P4 and a gate of the N channel MOS transistor N2, and an output node of the NAND gate circuit ND3 is connected to a gate of the P channel MOS transistor P6 and a gate of the N channel MOS transistor N3.

Therefore, when all of the write signal WRITE, the detection signal CHRDY and the row address signal RA1 become "H", a write current having a direction according to a value of the program data DATA flows through the write bit line WBL1.

For example, when the program data DATA is "1" (="H"), an output signal from the NAND circuit ND2 in the driver/decoder unit 13A-1 becomes "L", the P channel MOS transistor P4 enters the on state, and the N channel MOS transistor N2 enters the off state.

Further, an output signal from the NAND gate circuit ND3 in the driver/decoder unit 13B-1 becomes "H", the P channel MOS transistor P6 enters the off state, and the N channel MOS transistor N3 enters the on state.

Therefore, at this moment, a write current which is directed to the driver/decoder unit 13B-1 from the driver/decoder unit 13A-1 flows through the write bit line WBL1.

Here, in this example, a value of the write current is restricted by the P channel MOS transistor P3 in the driver/decoder unit 13A-1. That is, a gate potential of the P channel MOS transistor P3 is controlled by the differential amplifier DA4. The differential amplifier DA4 controls the gate potential of the P channel MOS transistor P3 in such a manner that the drain potential of the P channel MOS transistor P4, namely, the potential at one end of the write bit line WBL1 becomes equal to VLIMIT.

Therefore, the maximum value of the voltage applied to the both ends of the write bit line WBL1 is restricted to VLIMIT. That is, assuming that the wiring resistance of the write bit line WBL1 is R2, the maximum value of the write current flowing through the write bit line WBL1 is restricted to VLIMIT/R2.

When the program data DATA is "0" (="L"), an output signal from the NAND gate circuit ND2 in the driver/decoder unit 13A-1 becomes "H", the P channel MOS transistor P4 enters the off state, and the N channel MOS transistor N2 enters the on state.

Furthermore, an output signal from the NAND gate circuit ND3 in the driver/decoder unit 13B-1 becomes "L", the P channel MOS transistor P6 enters the on state, and the N channel MOS transistor N3 enters the off state.

Therefore, at this moment, a write current which is directed to the driver/decoder unit 13A-1 from the driver/decoder unit 13B-1 flows through the write bit line WBL1.

Here, in this example, a value of the write current is controlled by the P channel MOS transistor P5 in the driver/decoder unit 13B-1. That is, the gate potential of the P channel MOS transistor P5 is controlled by the differential amplifier DA5. The differential amplifier DA5 controls the gate potential of the P channel MOS transistor P5 in such a manner that the drain potential of the P channel MOS transistor P6, namely, the potential at the other end of the write bit line WBL1 becomes equal to VLIMIT.

Therefore, the maximum value of the voltage applied to the both ends of the write bit line WBL1 is restricted to VLIMIT. That is, assuming that the wiring resistance of the write bit line WBL1 is R2, the maximum value of the write current flowing through the write bit line WBL1 is restricted to VLIMIT/R2.

7. Conclusion

As described above, in the magnetic random access memory according to an aspect of the present invention, a value of the write current flowing through the write word line or the write bit line can be restricted to a fixed value or a lower value. As a result, erroneous data can be prevented from being written in a non-selected memory cell adjacent to a selected memory cell in the write operation.

In addition, when the cross point type cell array structure is provided, the write word line and the write bit line are connected to each other through the magneto-resistive effect element. According to the examples of the present invention, however, by controlling the potential at one end of the write word line and the potential at one end of the write bit line, the voltage applied to the magneto-resistive effect element can be restricted to a fixed value or a lower value, thereby preventing destruction of the magneto-resistive effect element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A magnetic random access memory comprising:
    a memory cell array determining an element having a magnetic layer as a memory cell;
    a first write line to write data in said memory cell; and
    a first driver connected to one end of said first write line,
    wherein said first driver has a first limiting circuit which limits a value of a write current given to said first write line to a fixed value or a lower value.

2. The magnetic random access memory according to claim 1, further comprising:
    a second write line which is used to write data in said memory cell and crosses said first write line; and
    a second driver connected to one end of said second write line,
    wherein said second driver has a second limiting circuit which limits a value of a write current given to said second write line to a fixed value or a lower value.

3. The magnetic random access memory according to claim 2, further comprising:
    a third driver connected to the other end of said second write line,
    wherein said third driver has a third limiting circuit which limits a value of a write current given to said second write line to a fixed value or a lower value.

4. The magnetic random access memory according to claim 3, wherein said first write line is a write word line, said first driver is a write word line driver, said second write line is a write bit line, and said second and third drivers are write bit line drivers.

5. The magnetic random access memory according to claim 3, wherein said third limiting circuit has a function to maintain, at a fixed value, a potential at the other end of said second write line when giving said write current to said second write line.

6. The magnetic random access memory according to claim 3, wherein said third limiting circuit is constituted by an MOS transistor and a circuit which determines a gate potential of said MOS transistor.

7. The magnetic random access memory according to claim 3, wherein said third limiting circuit is constituted by an MOS transistor and a differential amplifier which determines a gate potential of said MOS transistor based on a potential at the other end of said second write line and a reference potential.

8. The magnetic random access memory according to claim 2, wherein said second limiting circuit has a function to maintain, at a fixed value, a potential at one end of said second write line when giving said write current to said second write line.

9. The magnetic random access memory according to claim 2, wherein said second limiting circuit is constituted by an MOS transistor and a circuit which determines a gate potential of said MOS transistor.

10. The magnetic random access memory according to claim 2, wherein said second limiting circuit is constituted by an MOS transistor and a differential amplifier which determines a gate potential of said MOS transistor based on a potential at one end of said second write line and a reference potential.

11. The magnetic random access memory according to claim 1, wherein said first limiting circuit has a function to maintain, at a fixed value, a potential at one end of said first write line when giving said write current to said first write line.

12. The magnetic random access memory according to claim 1, wherein said first limiting circuit is constituted by an MOS transistor and a circuit which determines a gate potential of said MOS transistor.

13. The magnetic random access memory according to claim 1, wherein said first limiting circuit is constituted by an MOS transistor and a differential amplifier which determines a gate potential of said MOS transistor based on a potential at one end of said first write line and a reference potential.

14. The magnetic random access memory according to claim 1, wherein said memory cell array has a cross point type cell array structure.

* * * * *